(12) United States Patent
Fujii

(10) Patent No.: US 8,283,779 B2
(45) Date of Patent: Oct. 9, 2012

(54) PEEL-RESISTANT SEMICONDUCTOR DEVICE WITH IMPROVED CONNECTOR DENSITY, AND METHOD OF MANUFACTURING THE SAME

(75) Inventor: Seiya Fujii, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 326 days.

(21) Appl. No.: 12/467,587

(22) Filed: May 18, 2009

(65) Prior Publication Data
US 2009/0289358 A1    Nov. 26, 2009

(30) Foreign Application Priority Data
May 26, 2008  (JP) .................... 2008-136367

(51) Int. Cl.
   H01L 23/48     (2006.01)
   H01L 23/52     (2006.01)
   H01L 29/40     (2006.01)
(52) U.S. Cl. ........ 257/737; 257/738; 257/778; 257/783; 257/780
(58) Field of Classification Search .......... 257/737, 257/738, 786, 784, 773, 778, 690, 691, 693, 257/779, 780, 787, 776, 797; 438/FOR. 343, 438/613, 108, 612, 614
See application file for complete search history.

(56) References Cited

U.S. PATENT DOCUMENTS
| | | | | |
|---|---|---|---|---|
| 6,323,559 B1 * | 11/2001 | Chan et al. | ..................... | 257/778 |
| 6,324,069 B1 * | 11/2001 | Weber | ........................... | 361/783 |
| 2006/0279003 A1 * | 12/2006 | Maruyama et al. | ........... | 257/797 |

FOREIGN PATENT DOCUMENTS
| | | |
|---|---|---|
| JP | 11-177225 | 7/1999 |
| JP | 2000-058700 | 2/2000 |
| JP | 2002-100648 | 4/2002 |
| JP | 2006-210851 | 8/2006 |
| JP | 2007-012690 | 1/2007 |

\* cited by examiner

*Primary Examiner* — Ha Tran T Nguyen
*Assistant Examiner* — Thanh Y Tran
(74) *Attorney, Agent, or Firm* — Young & Thompson

(57) ABSTRACT

A semiconductor device includes a substrate and a plurality of bumps. The substrate is compartmentalized into a bump-free area provided along four sides of the substrate and a bump area which is surrounded by the bump-free area. The plurality of bumps is aligned in the bump area. The plurality of bumps includes a first group of bumps aligned along the four sides and a second group of bumps surrounded by the first group. A first subgroup of bumps included in the first group and aligned along one side of the four sides is shifted with respect to a second subgroup of bumps included in the first group and aligned along an opposing side of the four sides in a direction parallel to the one side.

19 Claims, 6 Drawing Sheets

PEEL-RESISTANT SEMICONDUCTOR DEVICE WITH IMPROVED CONNECTOR DENSITY, AND METHOD OF MANUFACTURING THE SAME

BACKGROUND OF THE INVENTION

1. Field of the Invention

The present invention relates to a semiconductor device, a method of manufacturing the same, and a substrate.

Priority is claimed on Japanese Patent Application No. 2008-136367, filed May 26, 2008, the content of which is incorporated herein by reference.

2. Description of the Related Art

With higher-performance and higher-speed semiconductor chips, miniaturization of packages has recently been required for multi-terminal packages and high density mounting of semiconductor chips. For example, a BGA (Ball Grid Array)-type semiconductor device is a miniaturized semiconductor device. On one surface of the BGA-type semiconductor device, an area where semiconductor elements are mounted and a wiring pattern to be electrically connected to the semiconductor elements are provided. On the other surface thereof, lands to which solder balls are to be connected are provided in a grid. Thereby, external terminals do not have to be provided on side surfaces thereof as required for QFP (Quad Flat Package)-type semiconductor devices, enabling miniaturization of the mounting area and therefore a mounting substrate. Further, a multi-terminal structure of a package can be implemented with miniaturization of the package.

FIG. 1 is a plane view illustrating an example of a conventional BGA-type semiconductor device 114 viewed from a bump-mounted surface (rear surface). The conventional BGA type semiconductor device 114 includes a bump-free area 118 along the four sides of a substantially rectangular package substrate (wiring substrate) 116, and a bump area 117 provided inside the bump-free area 118.

The bump area 117 is substantially rectangular, inside which circular bumps 120 are aligned in a 6×6 matrix. The bump-free area 118 has a given width from the four sides of the semiconductor device 114, inside which no bump 120 is aligned.

The smaller the bump-free area 118 is, the larger bump area 117 can be provided, and therefore more bumps 120 can be aligned inside the bump area 117, enabling the package substrate 116 to be efficiently used. However, the bump-free area 118 of the conventional BGA-type semiconductor device 114 cannot be reduced in size for the following two reasons.

The first reason is that methods of manufacturing the conventional BGA type semiconductor device use the MAP (Mold Array Package) method, causing problems in a process of manufacturing a semiconductor device if the bump-free area 118 having a given width is not provided.

In the MAP method of manufacturing a semiconductor device, multiple semiconductor chips or bumps are simultaneously mounted on one pre-cut substrate, and then the pre-cut substrate is diced into multiple semiconductor devices. Thereby, simplification of manufacturing processes, enhancement of work efficiency, and a reduction in manufacturing costs can be achieved. For this reason, this method is often used in a manufacturing field.

Respective semiconductor devices are adjacent to one another on the pre-cut substrate. For this reason, if bumps are aligned very close to dicing lines, bumps aligned across the dicing lines are very close to each other, causing the bumps to contact each other or a bridge upon reflowing the bumps. Therefore, a bump-free area having the given size has to be provided.

FIG. 2 is a plane view illustrating an example of a pre-cut substrate 111 viewed from a bump-mounted surface (rear surface) in a conventional MAP.

The pre-cut substrate 111 includes a handling area 113 provided along the four sides of the pre-cut substrate 111 to be used for manufacturing processes, inside which semiconductor devices 114 are aligned in a 3×4 matrix. The pre-cut substrate 111 is diced along the horizontal and vertical dicing lines 112 into 12 pieces of the semiconductor devices 114.

However, respective semiconductor devices 114 are aligned adjacent to one another. If bumps 120 are aligned very close to the dicing lines 112, the bumps 120 aligned across the dicing lines are very close to each other, causing the bumps 120 to contact each other or a bridge upon reflowing the bumps 120. For this reason, bump-free areas 118 having the given size has to be provided.

Thus, the bump-free areas 118 having the given width have to be provided, reducing the areas of bump areas 117 and therefore the number of bumps that can be aligned in the bump areas 17. Consequently, a package substrate 116 cannot efficiently be used. Therefore, a multi-terminal structure and miniaturization of the semiconductor devices 114 cannot be achieved.

The second reason that the bump-free areas 118 are necessary is to prevent land peeling. Generally, lands are provided between bumps and wiring substrate and connected to semiconductor chips through, for example, connection pads.

When the bump-free areas are reduced in size and bumps are aligned very close to the dicing lines, lands corresponding to respective bumps are also aligned very close to the dicing lines. The respective lands are fixed onto the package substrate by being pressed by a solder resist film applied between the bumps and the wiring substrate. However, if the bump-free areas do not have the given size, the effect of pressing by the solder resist film decreases. For this reason, outer lands close to the dicing lines might be peeled when the substrate is diced into pieces of the semiconductor devices. Therefore, the bump-free areas have to have the given width.

To save larger areas for the bump areas, a method of shifting outermost bumps can be considered. For example, Japanese Patent Laid-Open Publication No. 2007-12690 discloses a mounting structure of a BGA-type package.

In this method, outermost bumps are shifted by a half pitch with respect to respective inner bumps. Consequently, the outermost bumps are aligned horizontal to each other across dicing lines on a pre-cut substrate when the MAP method is used. Therefore, the outermost bumps cannot be prevented from contacting each other. Further, a bridge in a reflow process cannot be prevented either.

As a method of preventing land peeling, it can be considered to change the shape of lands. For example, Japanese Patent Laid-Open Publication No. H11-177225 discloses a print substrate on which solder resist clearances provided around respective pads and each having one or more protrusions are provided so that solder flow is restricted by the protrusions upon soldering.

Additionally, Japanese Patent Laid-Open Publication No. 2002-100648 discloses a semiconductor device including circular terminal electrodes with protrusions so that solder follows the protrusions, and consequently the bonding strength between the terminal electrodes and solder bumps increases.

Further, Japanese Patent Laid-Open Publication No. 2000-58700 discloses a BGA-type semiconductor device in which outer pads are rectangular so that solder life can be prolonged.

Moreover, Japanese Patent Laid-Open Publication No. 2006-210851 discloses a circuit substrate on which rectangular pads are provided to prevent pad peeling.

However, none of those can prevent outermost lands aligned close to dicing lines from peeling.

SUMMARY

In one embodiment, there is provided a semiconductor device including a substrate and a plurality of bumps. The substrate is compartmentalized into a bump-free area provided along four sides of the substrate and a bump area which is surrounded by the bump-free area. The plurality of bumps is aligned in the bump area. The plurality of bumps includes a first group of bumps aligned along the four sides and a second group of bumps surrounded by the first group. A first subgroup of bumps included in the first group and aligned along one side of the four sides is shifted with respect to a second subgroup of bumps included in the first group and aligned along an opposing side of the four sides in a direction parallel to the one side.

In another embodiment, there is provided a method of manufacturing a semiconductor device which includes the following processes. A substrate is compartmentalized by a plurality of dicing lines into a plurality of rectangular areas each including a bump-free area along four sides thereof and a bump area surrounded by the bump-free area. Then, a plurality of bumps are aligned in the bump area such that a first group of the plurality of bumps which is aligned along one of the dicing lines is shifted in a direction parallel to the one of the dicing lines so that a second group of the plurality of bumps aligned across the one of the dicing lines is not aligned horizontal to the first group of bumps. Then, the substrate is diced along the dicing lines.

In another embodiment, there is provided a substrate compartmentalized by a plurality of dicing lines into a plurality of rectangular areas each including a bump-free area along four sides thereof and a bump area surrounded by the bump-free area. A plurality of bumps are aligned in the bump area such that a first group of the plurality of bumps which is aligned along one of the dicing lines is shifted in a direction parallel to the one of the dicing lines so that a second group of the plurality of bumps aligned across the one of the dicing lines is not aligned horizontal to the first group of bumps.

Accordingly, land peeling can be prevented and a larger bump area can be saved, thereby enabling miniaturization and a multi-terminal structure of a semiconductor package.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated herein for explanatory purposes.

First Embodiment

Figure 1:
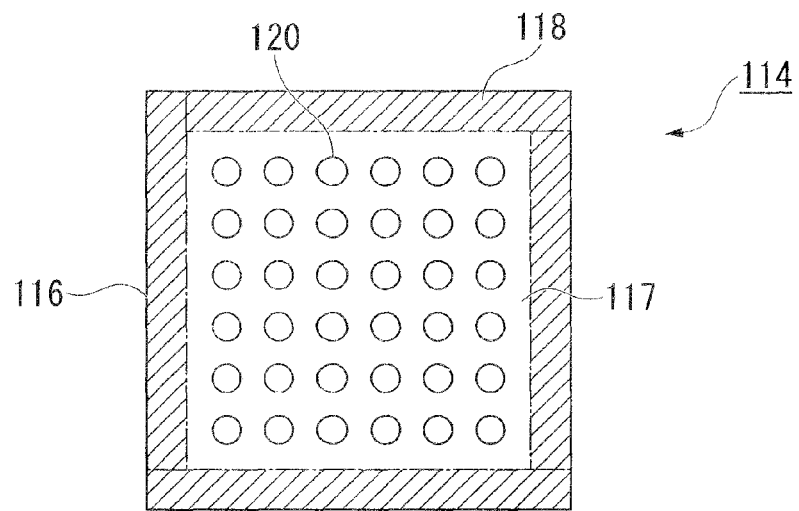
FIG. 1 is a plane view illustrating a conventional semiconductor device.
Figure 2:
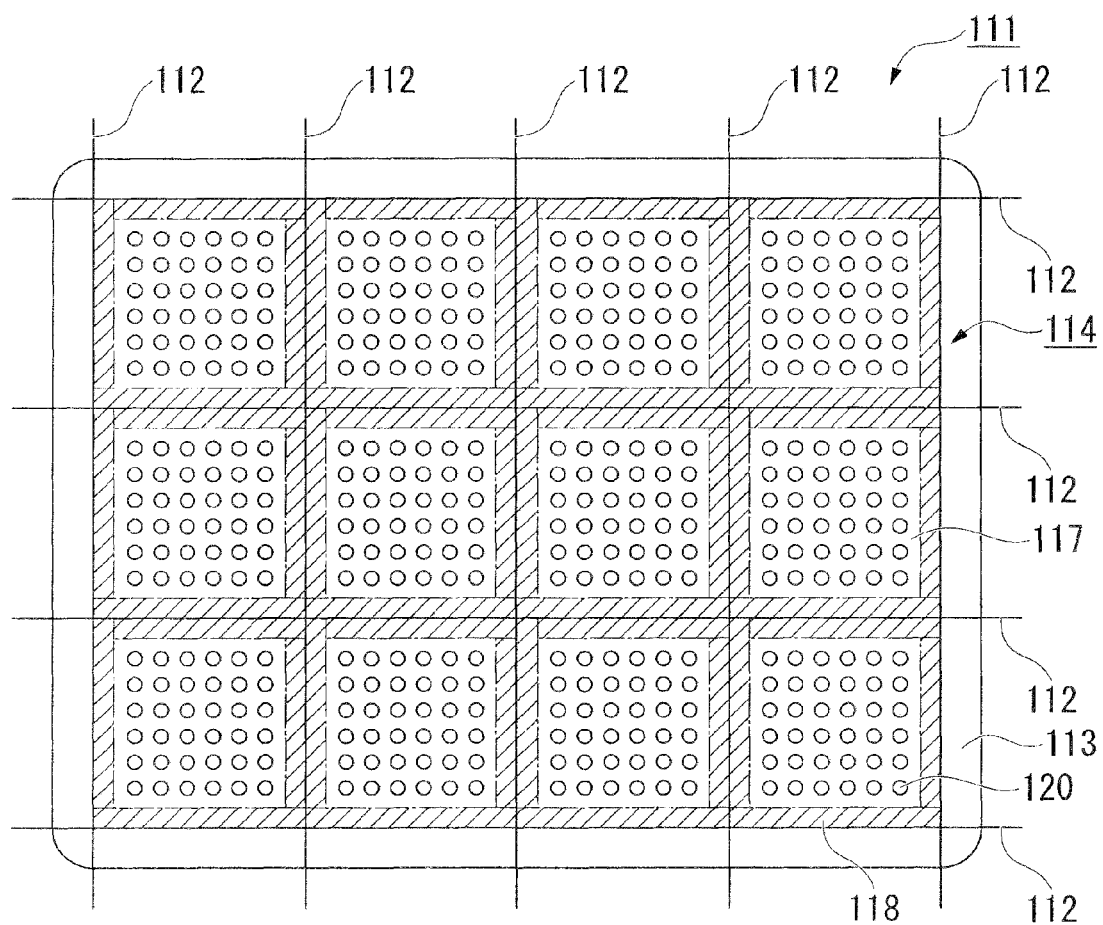
FIG. 2 is a plane view illustrating a conventional pre-cut substrate.
Figure 3:
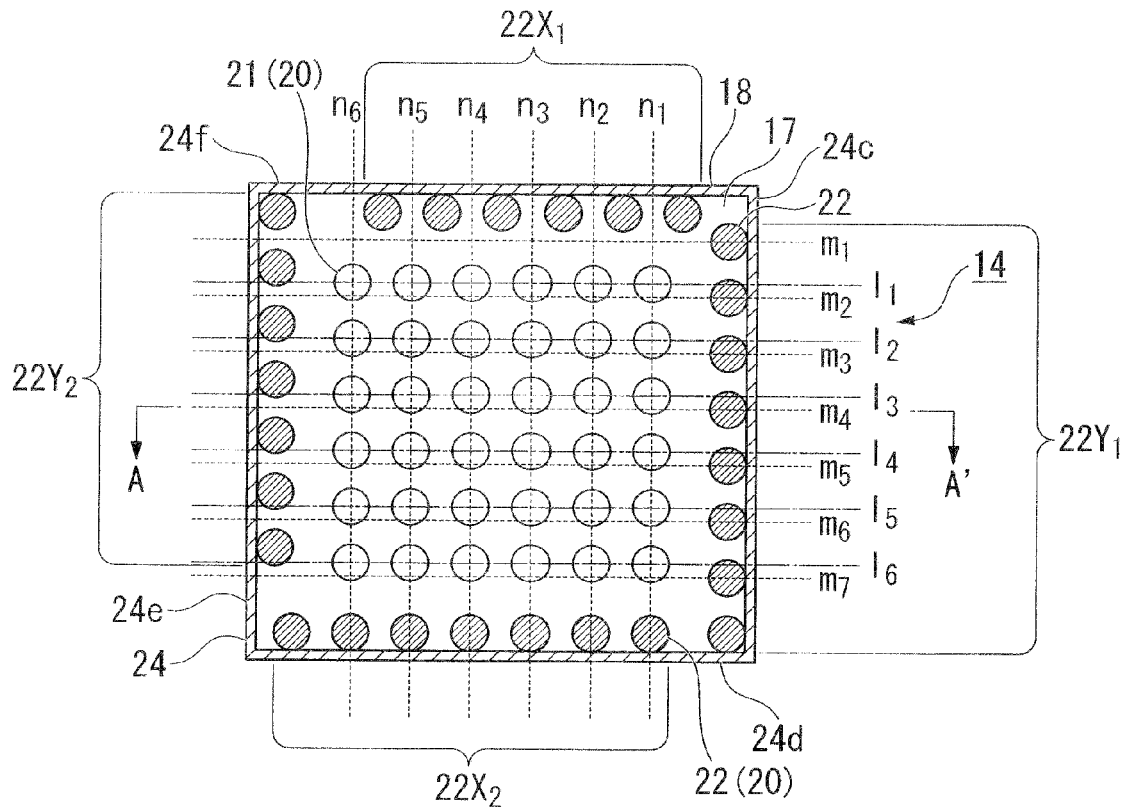
FIG. 3 is a plane view illustrating a semiconductor device according to a first embodiment of the present invention.

FIG. 3 is a plane view illustrating a semiconductor device 14 according to a first embodiment of the present invention.

The semiconductor device 14 includes a substantially rectangular wiring substrate 24, a bump free area 18 provided along the four sides of the wiring substrate 24, and a bump area 17 surrounded by the bump free area 18.

Multiple bumps 20 are aligned in the bump area 17 and include outermost bumps 22 aligned along the four sides of the bump area 17, and inner bumps 21 aligned in a grid inside the outermost bumps 22.

A line $22Y_1$ of the outermost bumps 22 aligned along one side 24c of the wiring substrate 24 is shifted in a direction parallel to the side 24c with respect to a line $22Y_2$ of the outermost bumps 22 aligned along another side 24e opposing the side 24c.

A line $22X_2$ of the outermost bumps 22 aligned along one side 24d of the wiring substrate 24 is shifted in a direction parallel to the side 24d with respect to a line $22X_1$ of the outermost bumps 22 aligned along another side 24f opposing the side 24d.

Thereby, the outermost bumps 22 do not contact each other upon manufacturing a BGA-type semiconductor device, and a bridge does not occur upon reflowing the outermost bumps 22.

Displacement of the outermost bumps 22 is explained hereinafter with reference to auxiliary lines $m_1$ to $m_7$ and $n_1$ to $n_6$ shown in FIG. 3. The auxiliary lines $m_1$ to $m_7$ passing through the centers of the outermost bumps 22 along the right side 24c pass through lower portions of the inner bumps 21 and in between the outermost bumps 22 along the left side 24e.

The auxiliary lines $n_1$ to $n_6$ passing through the centers of the outermost bumps 22 along the bottom side 24d pass through the substantially centers of the inner bumps 21 and in between the outermost bumps 22 along the top side 24f.

Thus, the outermost bumps 22 on the line $22Y_2$ are not aligned on the auxiliary lines $m_1$ to $m_7$ passing through the centers of the outermost bumps 22 on the line $22Y_1$. Similarly, the outermost bumps 22 on the line $22X_1$ are not aligned on the auxiliary lines $n_1$ to $n_6$ passing through the centers of the outermost bumps 22 on the bump line $22X_2$.

Thereby, the outermost bumps 22 do not contact each other upon manufacturing a BGA-type semiconductor device, and a bridge does not occur upon reflowing the outermost bumps 22.

The inner bumps 21 are aligned vertically and horizontally at substantially the same pitch in a 6×6 matrix. The outermost bumps 22 on the line $22X_2$ are not deviated from the vertical lines $n_1$ to $n_6$, but the outermost bumps 22 on the line $22X_1$ are deviated therefrom. Both the outermost bumps 22 on the line $22Y_1$ and the outermost bumps 22 on the line $22Y_2$ are deviated from the horizontal lines $1_1$ to $1_6$.

Thus, at least one of the outermost bumps 22 on the line $22X_1$ and the outermost bumps 22 on the line $22X_2$, or at least one of the outermost bumps 22 on the line $22Y_1$ and the outermost bumps 22 on line $22Y_2$ are preferably deviated from the vertical lines $n_1$ to $n_6$ or the horizontal lines $1_1$ to $1_6$. Thereby, the outermost bumps 22 do not contact one another and a bridge does not occur upon a reflow process when a BGA-type semiconductor device is manufactured using the MAP method.

Additionally, the outermost bumps 22 on the line $22X_1$ or the outermost bumps 22 on the line $22X_2$ are shifted toward the outside of the wiring substrate 24. Alternatively, the outermost bumps 22 on the line $22Y_1$ and the outermost bumps 22 on line $22Y_2$ are shifted toward the outside of the wiring substrate 24. Thereby, a larger area can be saved for the bump area 17.

The alignment of the inner bumps 21 is not limited to that shown in FIG. 3. Further, the size, the type, the number, and the mounting direction of the semiconductor chips 40, and the type of the bumps 20 are not considered here.

Figure 4:
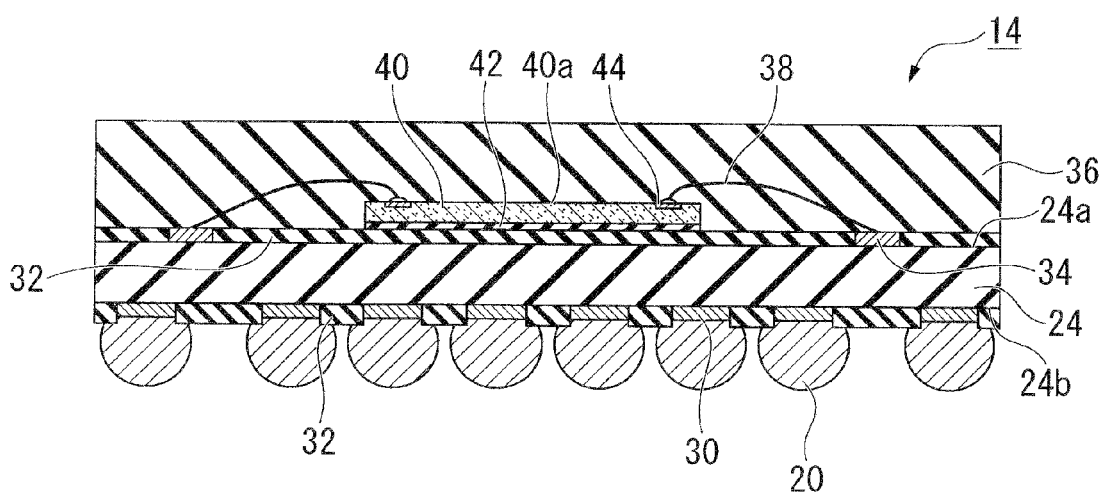
FIG. 4 is a cross-sectional view illustrating the semiconductor device according to the first embodiment.

FIG. 4 is a cross-sectional view taken along a line A-A' shown in FIG. 3. The semiconductor device 14 includes a wiring substrate 24 on which given wirings (not shown) are provided. The wiring substrate 24 is made of, for example, a glass epoxy board having the thickness of 0.25 mm.

An insulating solder resist film 32 is formed on the upper surface 24a of the wiring substrate 24 to protect the wirings (not shown) on the wiring substrate 24. The solder resist film 32 has openings exposing the surface 24a, onto which connection pads 34 are provided.

A semiconductor chip 40 is fixed on substantially the center of the solder resist film 32 through an insulating adhesive 42. Circuit elements (not show) such as a logic circuit or a memory circuit, and electrode pads 44 are provided on a surface 40a of the semiconductor chip 40. The electrode pads 44 are electrically connected to the connection pads 34 on the wiring substrate 24 through conductive wirings 38 which are made of metal, such as Au or Cu.

A seal 36 is formed on the surface 24a of the wiring substrate 24 to cover the semiconductor chip 40 the wirings 38, and the solder resist 32. The seal 36 is made of, for example, thermosetting resin, such as epoxy resin.

A solder resist film 32 is formed on the bottom surface 24b of the wiring substrate 24. The solder resist film 32 has multiple openings exposing the surface 24b, onto which lands 30 are provided. Spherical bumps 20 made of, for example, solder balls, are mounted on the respective lands 30.

The connection pads 34 and the lands 30 are electrically connected through wirings (not shown) provided in the wiring substrate 24. Thereby, the bumps 20 can be used as external terminals of the semiconductor chip 40.

Figure 5:
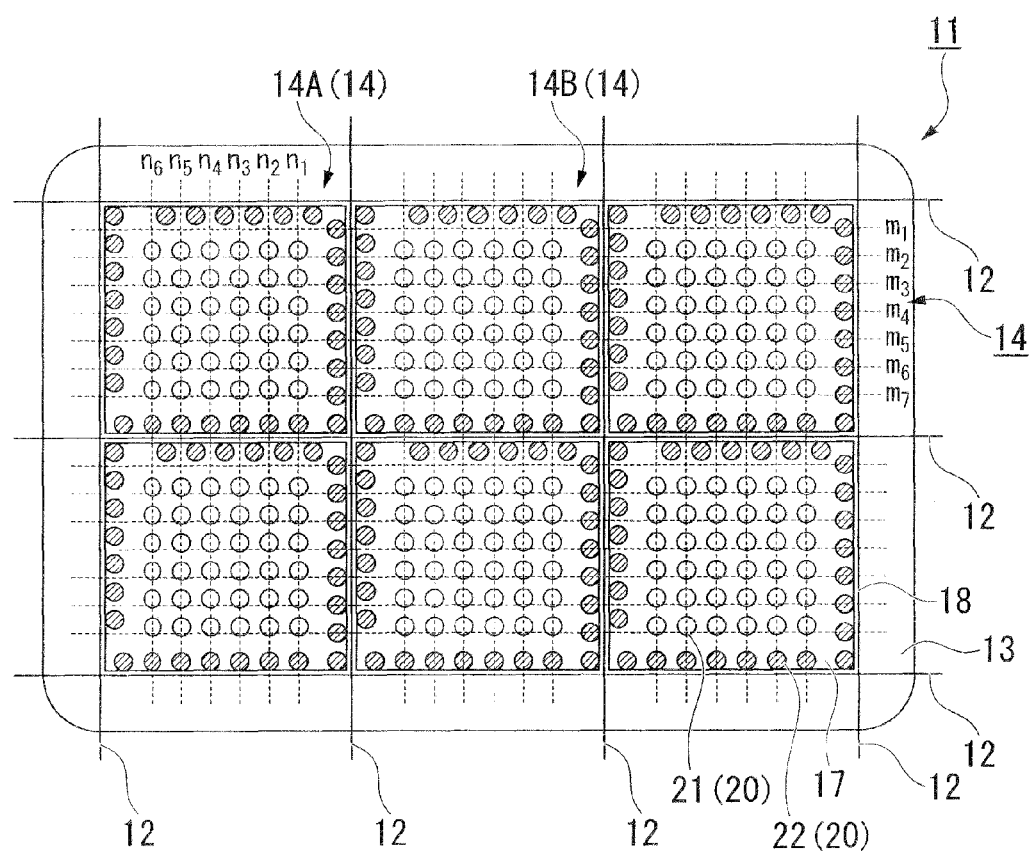
FIG. 5 is a plane view illustrating a pre-cut substrate according to the first embodiment.

FIG. 5 is a plane view illustrating a pre-cut substrate 11 according to the first embodiment. The pre-cut substrate 11 includes a handling area 13 to be used in a manufacturing process along the four sides thereof, inside of which semiconductor devices 14 are aligned in a 2×3 matrix. The pre-cut substrate 11 can be diced along vertical and horizontal dicing lines 12 into 6 pieces of the semiconductor devices 14 shown in FIG. 3.

Each semiconductor device 14 includes a bump-free area 18 provided along the dicing lines 12 and a bump area 17 surrounded by the bump-free area 18. Multiple bumps 20 including the outermost bumps 22 and the inner bumps 21 are aligned in the bump areas 17 in the same manner as shown in FIG. 3.

Hereinafter, displacement of the outermost bumps 22 is explained with semiconductor devices 14A and 14B shown in FIG. 5 taken as an example.

Figure 6:
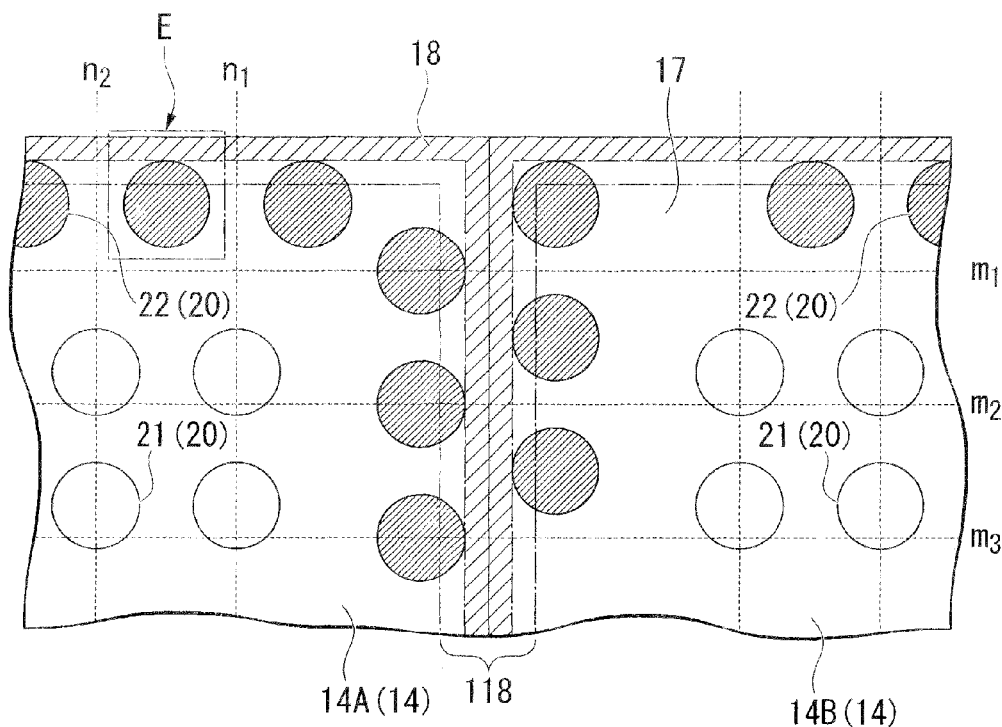
FIG. 6 is an enlarged plane view illustrating the pre-cut substrate according to the first embodiment.

FIG. 6 is an enlarged plane view illustrating an area around the dicing line 12 between the semiconductor devices 14A and 14B on the pre-cut substrate shown in FIG. 5. The outermost bumps 22 are shifted with respect to the inner bumps 21 in directions parallel to the dicing lines, enabling the width of the bump-free area 18 to be narrower than the conventional bump-free area 118 and the bump area 17 to be larger than the conventional bump area.

Figure 7:
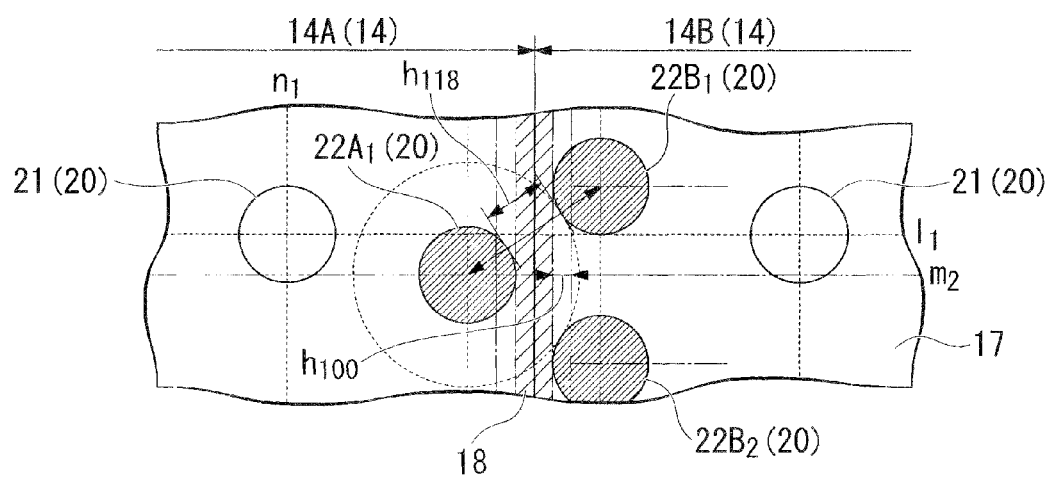
FIG. 7 is an enlarged plane view illustrating outermost bumps aligned on the pre-cut substrate according to the first embodiment.
Figure 8:
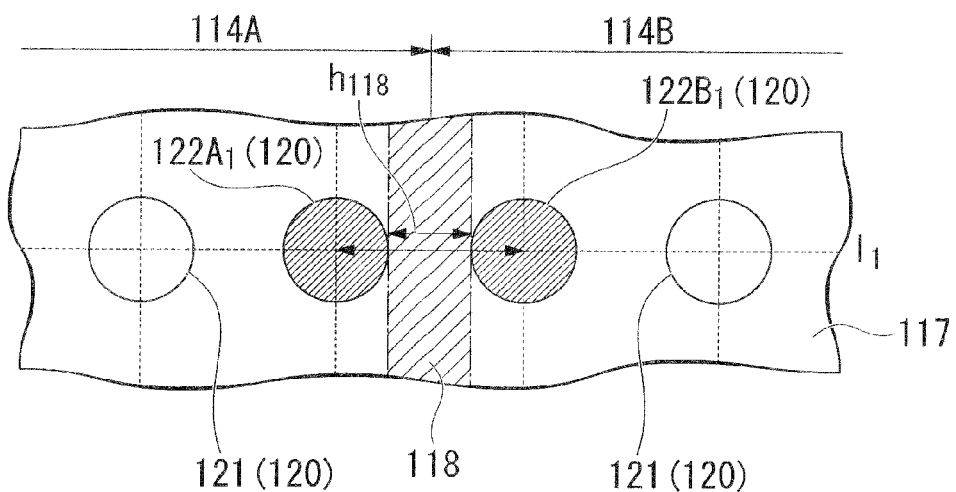
FIG. 8 is an enlarged plane view illustrating outermost bumps aligned on the conventional pre-cut substrate.

FIG. 7 is an enlarged plane view of FIG. 6. FIG. 8 is an enlarged plane view illustrating an area around the dicing line 12 between semiconductor devices 114A and 114B on the conventional pre-cut substrate. Hereinafter, displacement of the outermost bumps 22 is explained by comparison of FIGS. 7 and 8.

As shown in FIG. 8, a horizontal line $1_1$ passing through the center of an inner bump 121 on the semiconductor device 114A passes through the center of an outermost bump $122A_1$ on the semiconductor device 114A, and an outermost bumps $122B_1$ and an inner bump 121 on the semiconductor device 114B. These bumps are aligned at a given pitch. The width of the bump-free area is $h_{118}$.

On the other hand, as shown in FIG. 7, the horizontal line $1_1$ passing through the center of the inner bump 21 on the semiconductor device 14A passes through the center of the inner bump 21 on the semiconductor device 14B. However, an outermost bump $22B_1$ on the semiconductor device 14B is upwardly deviated from the line $1_1$. Similarly, an outermost bump $22B_2$ is upwardly deviated from another horizontal line. Additionally, an outermost bump $22A_1$ on the semiconductor device 14A is downwardly deviated from the horizontal line $1_1$ and aligned on the center line between the outermost bumps $22B_1$ and $22B_2$.

Further, the outermost bumps $22A_1$, $22B_1$, and $22B_2$ are shifted closer to the dicing line 12 such that the width of the bump-free area 18 is narrower than the width $h_{118}$ of the conventional bump-free area 118 by a distance $h_{100}$.

Thereby, the area of the bump area 17 can be larger than that of the conventional bump area 117, and therefore more bumps 20 can be mounted on the semiconductor device 14. Consequently, miniaturization and a multi-terminal structure of the semiconductor device 14 can be achieved.

Moreover, the distance between the outermost bumps $22A_1$ and $22B_1$ and the distance between the outermost bumps $22A_1$ and $22B_2$ are equally set to be the width $h_{118}$ of the conventional bump-free area 118. Thereby, the outermost bumps $22A_1$ do not contact the outermost bumps $22B_1$ and $22B_2$, and a bridge does not occur upon reflowing the outermost bumps $22A_1$, $22B_1$, and $22B_2$.

Figure 9:
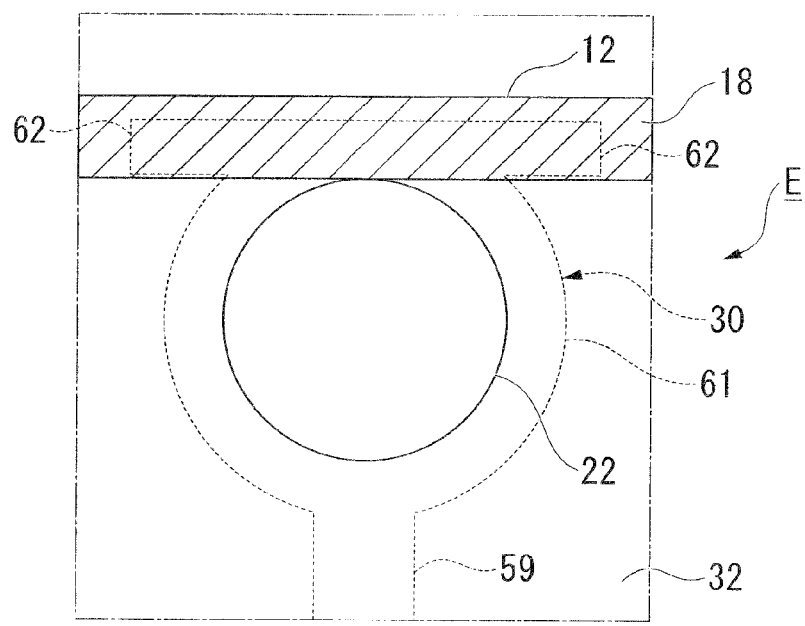
FIG. 9 is an enlarged plane view illustrating a land pattern of the semiconductor device according to the first embodiment.

FIG. 9 is an enlarged plane view illustrating a portion E shown in FIG. 6 and a plane shape of a land 30 provided between the outermost bump 22 and the wiring substrate 24. The land 30 includes a circular body 61, two protrusions 62 protruding from the body 61, and a wiring unit 59 electrically connected to, for example, a semiconductor chip.

The protrusions 62 are substantially rectangular and have longitudinal sides in parallel with the dicing line 12. Thereby, when the solder resist film 32 is applied to cover the outer circumference of the body 61, the solder resist film 32 presses the protrusions 62 and therefore strongly fixes the land 30, thereby preventing the outermost land 30 from peeling.

If the protrusions 62 are not formed, the area of the land 30 not covered by the solder resist film 32 decreases, thereby increasing the probability of land peeling. The length and the number of the protrusions 62 are not limited to those shown in FIG. 9, and various modifications can be made according to need.

The body 61 is preferably circular so that the solder resist 32 can be applied to equally cover the outer circumference of the body 61, press the outer circumference, and therefore strongly fix the land 30, thereby preventing the outermost land 30 from peeling.

Hereinafter, a method of manufacturing the semiconductor device according to the first embodiment is explained.

The semiconductor device manufacturing method according to the first embodiment is a method of manufacturing a BGA-type semiconductor device using the MAP method and includes: a land formation process of providing, on a surface of a wiring substrate which is not the one on which multiple semiconductor chips are provided, dicing lines for compartmentalizing the wiring substrate into multiple semiconductor devices, providing bump-free areas along the dicing lines and bump areas respectively surrounded by the bump-free areas, and forming multiple lands in the bump areas; a bump formation process of aligning bumps on the respective lands to form a pre-cut substrate; and a dicing process of dicing the pre-cut substrate into multiple pieces of the semiconductor devices. Like reference numerals denote like elements shown in FIGS. 3 and 5, hereinafter.

The semiconductor device manufacturing method according to the first embodiment is similar to the conventional method of manufacturing the BGA-type semiconductor device using the MAP method except for the land formation process.

In the land formation process, the lands 30 are formed in the bump areas 17 so that two lines of outermost bumps 22 provided across the dicing line 12 are mutually shifted in a direction parallel to the dicing line 12 in the bump formation process. Thereby, the outermost bumps 22 do not contact each other upon manufacturing a BGA-type semiconductor device, and a bridge does not occur upon reflowing the outermost bumps 22.

Additionally, the outermost bumps 22 on the line $22X_1$ or the outermost bumps 22 on the line $22X_2$ may be shifted in one direction parallel to the sides 24d and 24f. Alternatively, the outermost bumps 22 on the line $22Y_1$ and the outermost bumps 22 on line $22Y_2$ may be shifted in one direction parallel to the sides 24c and 24e. Thereby, the outermost bumps 22 do not contact each other upon manufacturing a BGA-type semiconductor device, and a bridge does not occur upon reflowing the outermost bumps 22. Further, the bump area 17 can be larger.

Then, the bump formation process and the dicing process are carried out after the lands are formed in this manner. Thereby, a larger bump area 17 can be saved, and miniaturized semiconductor devices having a multi-terminal structure can stably be manufactured.

According to the semiconductor device 14, the pre-cut substrate 11, the method of manufacturing the semiconductor device 14 using the MAP method explained above, the outermost bumps 22 aligned across dicing lines do not contact each other, and a bridge does not occur in a reflow process.

Additionally, even if the number of bumps is not required to be increased, the inner bumps 21 can be aligned at a larger pitch compared to the conventional inner bumps, thereby increasing freedom of wire drawing.

Further, peeling of the outermost lands can be prevented since the solder resist film 32 applied to the outer circumference of the circular body 61 presses the protrusions 62 and thereby firmly fixes the land 30. Therefore, defective products caused by peeling of outermost lands can be decreased.

Moreover, the bump area 17 can be larger than the conventional bump area 117, and therefore more bumps 20 can be mounted on the semiconductor device 14, thereby achieving miniaturization and a multi-terminal structure of the semiconductor device 14.

Second Embodiment

Figure 10:
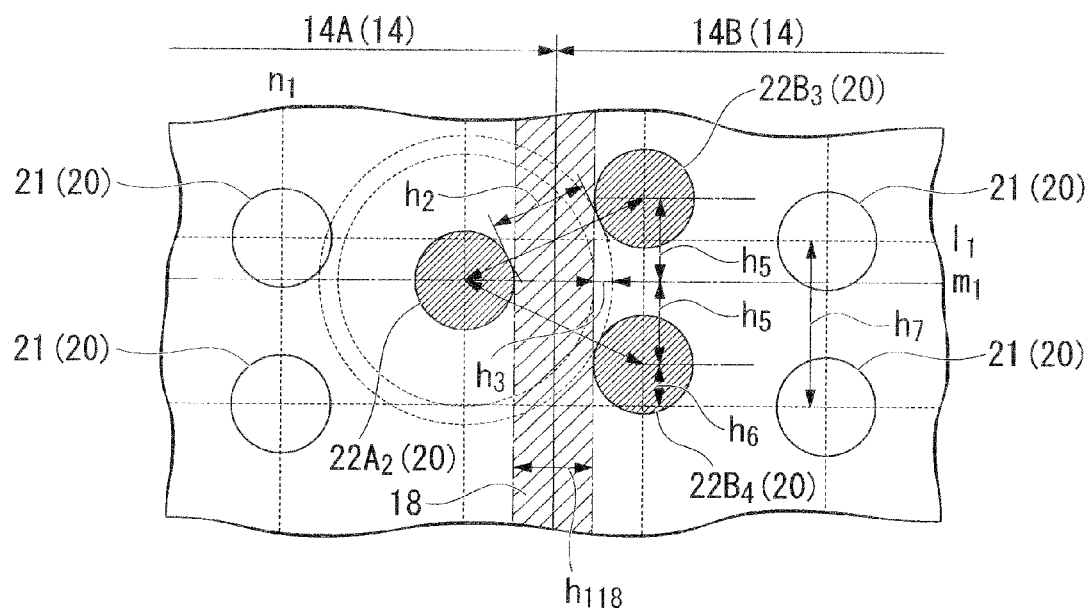
FIG. 10 is an enlarged plane view illustrating outermost bumps aligned on a precut substrate according to a second embodiment of the present invention.

FIG. 10 is a plane view illustrating alignment of outermost bumps according to a second embodiment of the present invention. FIG. 10 illustrates two inner bumps 21 and one outermost bump $22A_2$ on the semiconductor device 14A, and two inner bumps 21 and two outermost bumps $22B_3$ and $22B_4$ on the semiconductor device 14B.

The horizontal line $l_1$ passing through the center of the inner bump 21 on the semiconductor device 14A passes through the center of the inner bump 21 on the semiconductor device 14B. The outermost bump $22B_3$ on the semiconductor device 14B is upwardly deviated from the horizontal line $l_1$ by a distance $h_6$. Similarly, the outermost bump $22B_3$ on the semiconductor device 14B is upwardly deviated from another horizontal line by the same distance.

On the other hand, the outermost bump $22A_2$ on the semiconductor device 14A is downwardly deviated from the horizontal line $l_1$ and aligned in the center between the outermost bumps $22B_3$ and $33B_4$.

Thus, the outermost bump $22A_2$ is shifted in a direction parallel to the dicing line 12 with respect to the outermost bumps $22B_3$ and $22B_4$ adjacent to the outermost bump $22A_2$ across the dicing line 12. Thereby, the distance between the outermost bumps $22A_2$ and $22B_3$ and the distance between the outermost bumps $22A_2$ and $22B_4$ are equally a distance $h_2$ which is longer than the conventional distance $h_{118}$ by a distance $h_3$.

Accordingly, the outermost bumps $22A_2$, $22B_3$, and $22B_4$ do not contact one another and a bridge does not occur upon reflowing the outermost burps $22A_2$, $22B_3$, and $22B_4$.

Most preferably, the distance $h_6$ is one fourth of a bump pitch $h_7$ of the inner bumps 21. Specifically, the outermost bumps aligned along the four sides of the semiconductor device 14 are clockwise shifted by one fourth of the bump pitch $h_7$.

Third Embodiment

Figure 11:
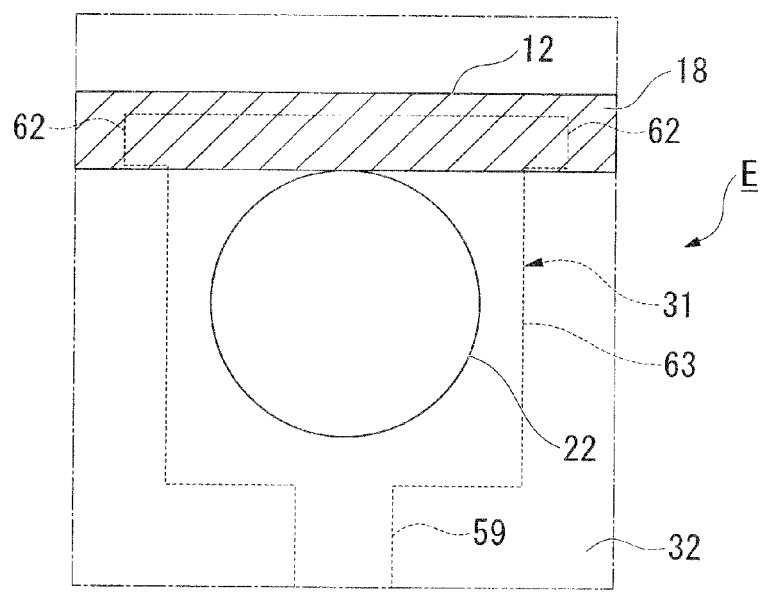
FIG. 11 is an enlarged plane view illustrating a land pattern of a semiconductor device according to a third embodiment of the present invention.

FIG. 11 is an enlarged plane view illustrating another example of the portion E shown in FIG. 6, i.e., a plane shape of a land 31 according to a third embodiment of the present invention.

The land 31 includes a rectangular body 63, the two protrusions 62 protruding from the body 63, and the wiring unit 59 to be electrically connected to, for example, a semiconductor chip. The land 31 has the same structure as the land 30 shown in FIG. 9 except for the shape of the body 63.

The longitudinal sides of the rectangular protrusions 62 are in parallel with the dicing line 12. Thereby, the land 31 can strongly be pressed by the solder resist film 32 applied to cover the outer circumference of the body 63, preventing the outermost lands from peeling.

The present invention relates to a method of manufacturing a pre-cut substrate and a semiconductor device and applicable to the semiconductor manufacturing industries.

As used herein, the following directional terms "forward, rearward, above, downward, vertical, horizontal, below, and transverse" as well as any other similar directional terms refer to those directions of a device equipped with the present invention. Accordingly, these terms, as utilized to describe the present invention should be interpreted relative to a device equipped with the present invention.

It is apparent that the present invention is not limited to the above embodiments, but may be modified and changed without departing from the scope and spirit of the invention.

What is claimed is:

1. A semiconductor device, comprising:
a substrate having a first surface and a second surface opposing the first surface, the second surface being compartmentalized into a bump-free area provided along four sides of the substrate and a bump area which is surrounded by the bump-free area;
a plurality of connection pads provided on the first surface of the substrate;
a semiconductor chip mounted on the first surface of the substrate, the semiconductor chip being electrically coupled to the plurality of connection pads; and
a plurality of bumps provided on the bump area of the second surface, the plurality of bumps being electrically coupled to the plurality of connection pads, respectively,
wherein the plurality of bumps includes a first group of bumps aligned along the four sides and a second group of bumps surrounded by the first group, and a first subgroup of bumps included in the first group and aligned along one side of the four sides is shifted with respect to a second subgroup of bumps included in the first group and aligned along an opposing side of the four sides in a direction parallel to the one side.

2. The semiconductor device according to claim 1, wherein the second subgroup of bumps is not on a plurality of auxiliary lines which are perpendicular to the one side and the opposing side and respectively pass through centers of the first subgroup of bumps.

3. The semiconductor device according to claim 2, wherein the first subgroup of bumps is deviated from a plurality of auxiliary lines which are perpendicular to the one side and respectively pass through centers of the bumps included in the second group.

4. The semiconductor device according to claim 1, wherein at least one of the first subgroup of bumps and the second subgroup of bumps is shifted toward an outside of the substrate.

5. The semiconductor device according to claim 1, further comprising a plurality of lands provided between the plurality of bumps and the substrate, wherein each of the lands comprises a body to be connected to one of the plurality of bumps, and protrusions protruding from the body along one of the four sides which is nearest to the one of the plurality of bumps.

6. The semiconductor device according to claim 5, wherein the body is circular or rectangular.

7. A semiconductor device, comprising:
a substrate including a first surface and a second surface opposed to the first surface, the second surface being defined by first and second side edges opposed to each other and by third and fourth side edges opposed to each other;
a semiconductor chip mounted on the first surface of the substrate, the semiconductor chip being smaller in size than the substrate;
a plurality of first bumps arranged along the first side edge of the second surface; and
a plurality of second bumps arranged along the second side edge of the second surface,
wherein the first and second bumps are positioned so that lines, extending respectively from the first bumps toward the second bumps and substantially parallel to the third side edge, are deviated from lines extending respectively from the second bumps toward the first bumps and substantially parallel to the third side edge.

8. The semiconductor device according to claim 7, further comprising:
a plurality of third bumps arranged along the third side edge of the second surface; and
a plurality of fourth bumps arranged along the fourth side edge of the second surface,
wherein the third and fourth bumps are positioned so that lines, extending respectively from the third bumps toward the fourth bumps and substantially parallel to the first side edge, are deviated from lines extending respectively from the fourth bumps toward the third bumps and substantially parallel to the first side edge.

9. The semiconductor device according to claim 7, further comprising:
a plurality of first lands provided between the second surface of the substrate and the first bumps, respectively; and
a plurality of second lands provided between the second surface of the substrate and the second bumps, respectively.

10. The semiconductor device according to claim 9, further comprising:
a solder resist layer provided on the second surface of the substrate to cover a periphery portion of the first and second lands with the solder resist layer.

11. The semiconductor device according to claim 10, wherein the first lands including a first protrusion protruding from the periphery portion, and the second lands including a second protrusion protruding from the periphery portion.

12. The semiconductor device according to claim 11, wherein the first protrusion arranged adjacent to the first side edge of the second surface of the substrate such that the first protrusion is protruded substantially parallel to the first side edge, and the second protrusion arranged adjacent to the second side edge of the second surface of the substrate such that the second protrusion is protruded substantially parallel to the second side edge.

13. The semiconductor device according to claim 7, further comprising:
a seal layer provided on the first surface of the substrate to cover the semiconductor chip.

14. A semiconductor device comprising:
a substrate having a first surface delimited by first and second side edges opposed to each other and by third and fourth side edges opposed to each other;
a plurality of first bumps arranged along the first side edge;
a plurality of second bumps arranged along the second side edge;
a plurality of third bumps arranged along the third side edge;
a plurality of fourth bumps arranged along the fourth side edge; and
a semiconductor chip mounted on a second surface of the substrate, the second surface opposing the first surface of the substrate, and the semiconductor chip being electrically coupled to the first, second, third, and fourth bumps, the first and second bumps being positioned so that lines, extending respectively from the first bumps and substantially parallel to the third side edge, are offset from lines that extend respectively from the second bumps and substantially parallel to the third side edge, the third and fourth bumps being positioned so that lines, extending respectively from the third bumps and substantially parallel to the first side edge, are offset from lines that extend respectively from the fourth bumps substantially parallel to the first side edge, and a distance between two adjacent ones of the first bumps is substantially equal to a distance between two adjacent ones of the third bumps.

15. The semiconductor device according to claim 14, further comprising:

a plurality of first lands provided between the first surface of the substrate and the first bumps, respectively;

a plurality of second lands provided between the first surface of the substrate and the second bumps, respectively;

a plurality of third lands provided between the first surface of the substrate and the third bumps; and a plurality of fourth lands provided between the first surface of the substrate and the fourth bumps.

16. The semiconductor device according to claim 15, further comprising:

a solder resist layer provided on the first surface of the substrate, the solder resist layer covering a plurality of first periphery portions of the first lands, a plurality of second periphery portions of the second lands, a plurality of third periphery portions of the third lands, and a plurality of fourth periphery portions of the fourth lands.

17. The semiconductor device according to claim 16, wherein each of the first lands includes a first protrusion protruding from associated one of the first periphery portions, each of the second lands includes a second protrusion protruding from associated one of the second periphery portions, each of the third lands includes a third protrusion protruding from associated one of the third periphery portions, and each of the fourth lands includes a fourth protrusion protruding from associated one of the fourth periphery portions.

18. The semiconductor device according to claim 17, wherein the first protrusion arranged adjacent to the first side edge of the first surface of the substrate such that the first protrusion protrudes substantially parallel to the first side edge, the second protrusion arranged adjacent to the second side edge of the first surface of the substrate such that the second protrusion protrudes substantially parallel to the second side edge, the third protrusion arranged adjacent to the third side edge of the first surface of the substrate such that the third protrusion protrudes substantially parallel to the third side edge, and the fourth protrusion arranged adjacent to the fourth side edge of the first surface of the substrate such that the fourth protrusion protrudes substantially parallel to the fourth side edge.

19. The semiconductor device according to claim 14, further comprising:

a plurality of connection pads provided on the second surface of the substrate, and electrically coupled to the first, second, third, and fourth bumps, and the semiconductor chip being electrically coupled to the first, second, third, and fourth bumps via the connection pads.

* * * * *